United States Patent [19]

Ao

[11] Patent Number: 5,828,116
[45] Date of Patent: Oct. 27, 1998

[54] SEMICONDUCTOR DEVICE WITH BONDED WIRES

[75] Inventor: Kenichi Ao, Tokai, Japan

[73] Assignee: Denso Corporation, Kariya, Japan

[21] Appl. No.: 786,764

[22] Filed: Jan. 21, 1997

[30] Foreign Application Priority Data

Jan. 22, 1996 [JP] Japan ................................. 8-008678

[51] Int. Cl.⁶ .................................................. H01L 29/82
[52] U.S. Cl. ......................... 257/417; 257/418; 257/420; 257/695; 257/735; 257/786; 73/514.33; 73/514.34; 73/726; 73/727
[58] Field of Search ................................ 257/417, 418, 257/420, 783, 786, 784, 735, 736, 695, 692; 73/514.33, 514.34, 720, 721, 726, 727

[56] References Cited

U.S. PATENT DOCUMENTS 4,949,160  8/1990  Ohno .................................. 257/695 X

FOREIGN PATENT DOCUMENTS

| 403018067 A | 1/1991 | Japan ........................... 257/417 |
| 4-307748 | 10/1992 | Japan . |
| 405243462 A | 9/1993 | Japan ........................... 257/695 |
| 6-258342 | 9/1994 | Japan . |

*Primary Examiner*—William Mintel
*Attorney, Agent, or Firm*—Cushman Darby & Cushman IP Group of Pillsbury Madison & Sutro LLP

[57] ABSTRACT

The present invention provides an improved method of wire-bonding on a semiconductor chip, especially a small acceleration sensor chip which is mounted on a substrate with an adhesive having low stress characteristics such as a silicon resin. Further, the present invention provides a semiconductor device having a structure in which the improved method of wire bonding is easily applicable. The wire-bonding is performed by giving ultrasonic vibrations to the wires and the pads on which the wires are bonded while imposing pressure thereon. The vibration is given in a direction along a radial line extending from the center of the semiconductor chip.

9 Claims, 11 Drawing Sheets

SEMICONDUCTOR DEVICE WITH BONDED WIRES

CROSS-REFERENCE TO RELATED APPLICATION

The present invention is related to and claims priority from Japanese Patent Application No. Hei-8-8678, incorporated herein by reference.

BACKGROUND OF THE INVENTION

1. Field of the Invention

The present invention relates to a method of wire bonding used in semiconductor devices, and more particularly to a method of ultrasonic wire bonding. The present invention also relates to semiconductor devices which have wires bonded by the ultrasonic bonding method.

2. Description of Related Art

Figure 17:
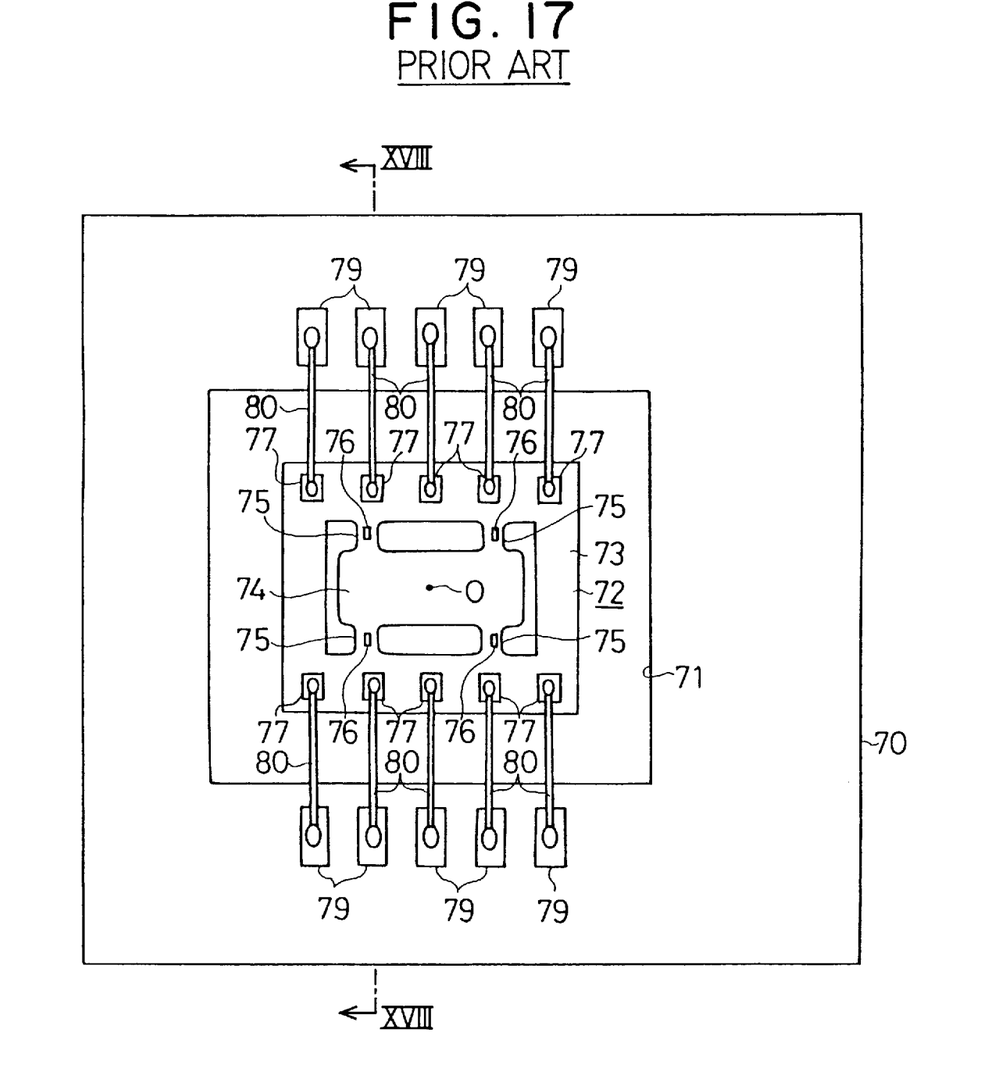
FIG. 17 is a plan view of a prior art acceleration sensor.
Figure 18:
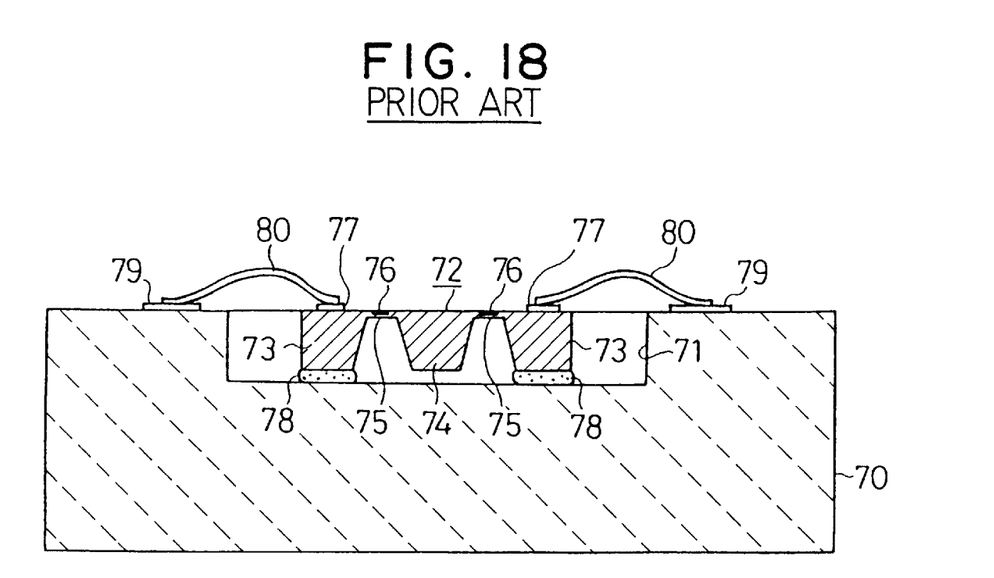
FIG. 18 is a cross-sectional view along a line XVIII—XVIII of FIG. 17.

An example of an acceleration sensor having connecting wires which are bonded in a conventional method is shown in FIGS. 17 and 18. As shown in the drawings, a sensor chip 72 is mounted in a cavity 71 which is made on a substrate 70. The sensor chip has a rectangular frame 73, a weight 74 and four bridge portions 75. The weight 74 is suspended by the bridge portions 75 inside the frame 73. Stress gages 76 are mounted on the respective bridge portions 75. A plurality of bonding pads 77 are formed on the sensor chip 72. The sensor chip 72 is mounted in the cavity 71 by an adhesive 78. To decrease stress given from the substrate 70 to the sensor chip 72, the adhesive 78 must be a material having low stress characteristics. In this example, a silicon resin adhesive is used. Bonding pads 79 are formed on an upper surface of the substrate 70. The bonding pads 77 on the sensor chip 72 and the bonding pads 79 on the substrate 70 are connected by bonding wires 80. The wires are bonded by ultrasonic bonding after the sensor chip 72 are mounted on the substrate 70 by the adhesive 78.

Recently, it is required to make the sensor chip smaller to reduce its cost. To make the sensor chip smaller, it is necessary to reduce the area for the frame 73 and the weight 74. Accordingly, the area for the frame 73 for mounting the sensor chip 72 on the substrate 70 must also be smaller. This results in a weaker adhesive strength between the sensor chip 72 and the substrate 70. The weaker adhesive strength further results in a poor bonding strength between the bonding pads and the wires. To obtain a higher adhesive strength, an adhesive having a higher bonding strength and a higher Young's modulus can be used for ordinary semiconductor chips. However, in the case of the acceleration sensor, this kind of adhesive cannot be used. If such an adhesive having a high Young's modulus, i.e., high stress characteristics, is used, acceleration detection errors would occur, because deformation stress caused by the difference of coefficients of linear expansion between the substrate and the sensor chip cannot be absorbed by the adhesive and strain is given to the sensor chip even when there is no actual acceleration. Therefore, an adhesive having a high Young's modulus cannot be used for the acceleration sensor.

SUMMARY OF THE INVENTION

An object of the present invention is to provide an improved and effective method of wire bonding for semiconductor chips which are mounted on a substrate by adhesives having low stress characteristics. Another object of the present invention is to provide semiconductor devices which have a suitable structure for the improved wire bonding method.

Figure 15:
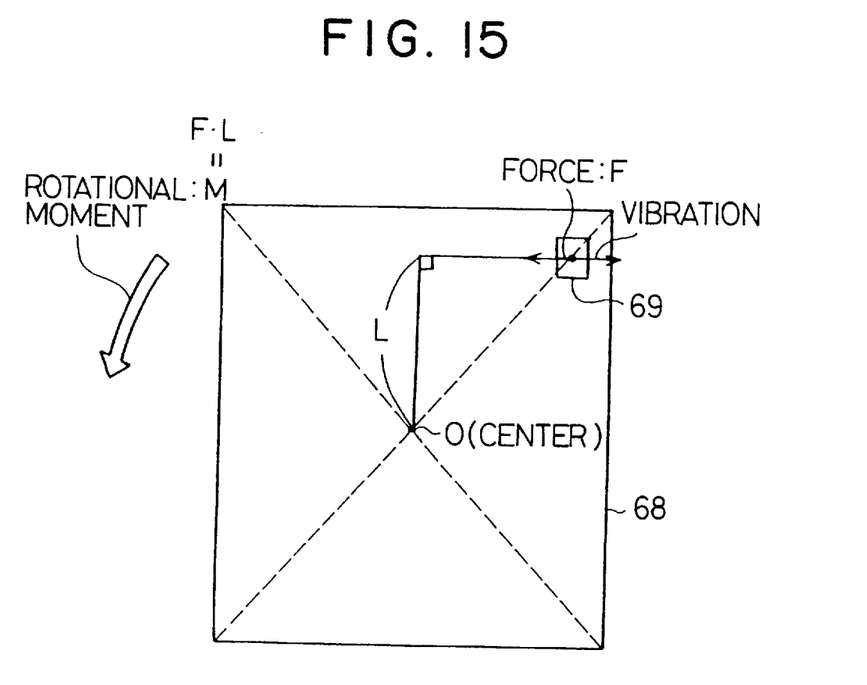
FIG. 15 is a model for explaining a rotational moment given to the sensor chip during the bonding process.
Figure 16:
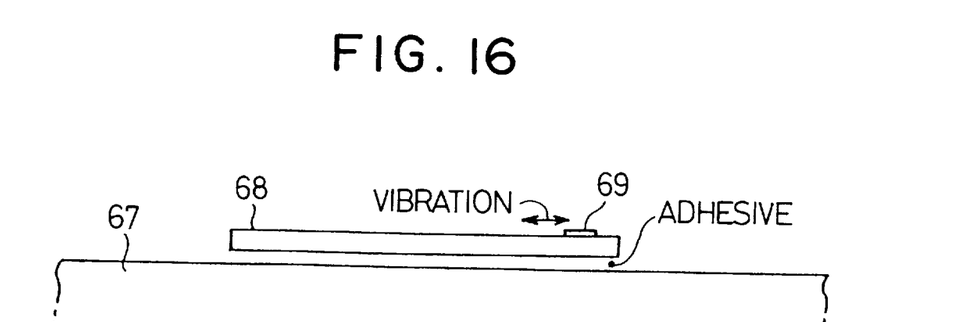
FIG. 16 is a side view of FIG. 15.

The wire bonding strength of the conventional device as shown in FIG. 17 was tested. As a result, more bonding defects were found on wires which were located away from the center of the chip. For analyzing these facts, a model shown in FIGS. 15 and 16 is taken into consideration. A chip 68 is mounted on a flat substrate 67 using an adhesive having low stress characteristics. The adhesive can be assumed to be an air cushion in the model. When a vibration in the direction shown in FIG. 15 is given to a bonding pad 69 located at a corner of the chip 68, the chip is vibrated by a moment M (=F×L) which rotates the chip around its center "O". It is conceivable that the vibration caused by the moment M prevents a stable bonding.

The present invention seeks to eliminate the rotational moment caused by ultrasonic vibration given to the bonding pad during the wire bonding process. For this purpose, in the present invention, the ultrasonic vibration is given to bonding pads in the direction toward the center O of the chip, thereby eliminating the moment M.

DETAILED EXPLANATION OF THE PREFERRED EMBODIMENTS

A first embodiment of the present invention will be explained referring to the accompanying drawings.

Figure 1:
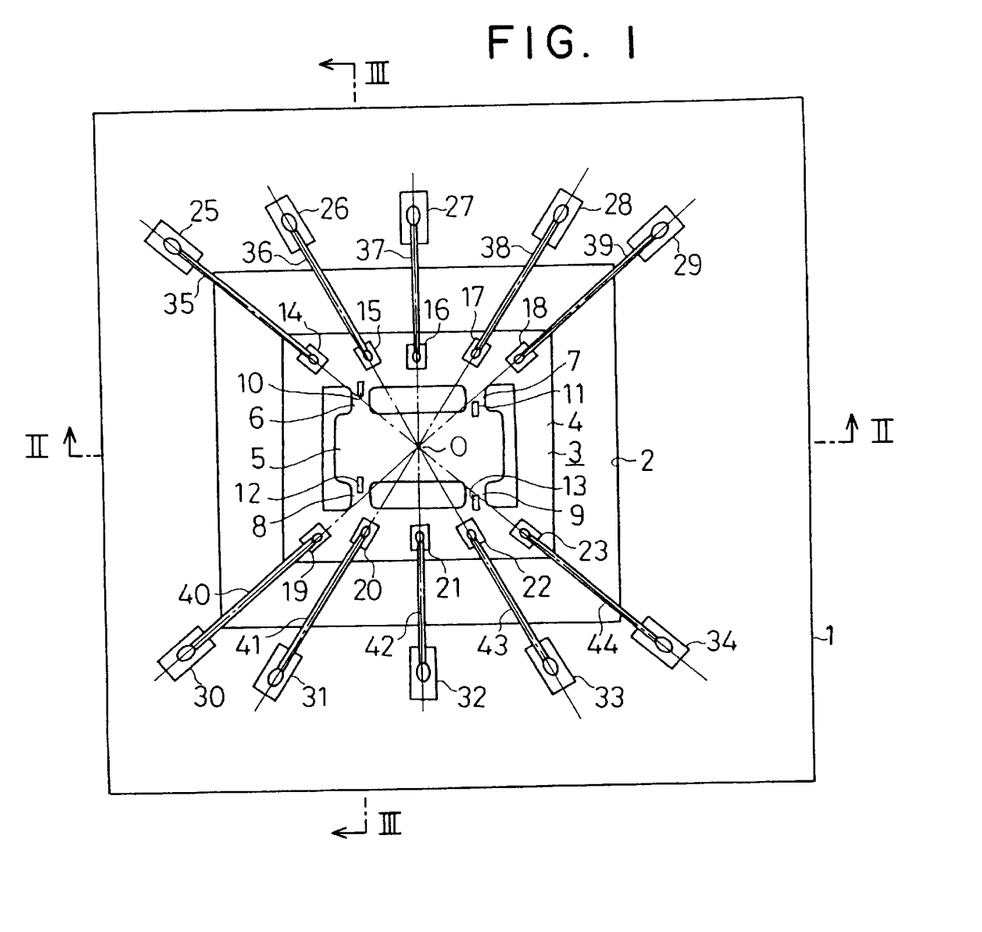
FIG. 1 is a plan view of an acceleration sensor of a first embodiment of the present invention.
Figure 2:
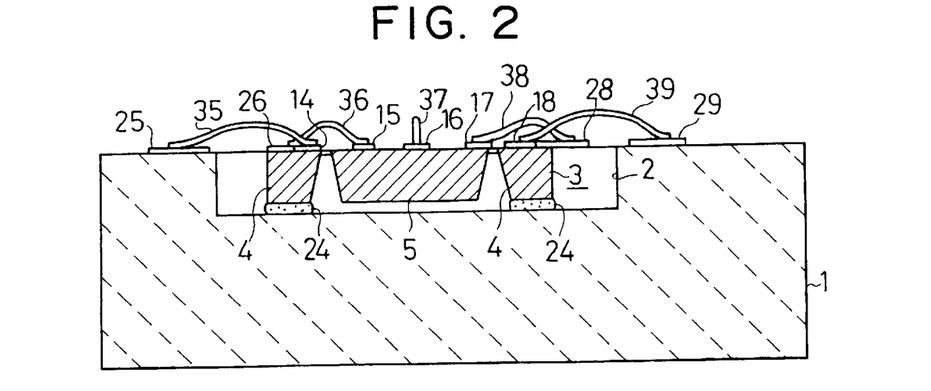
FIG. 2 is a cross-sectional view along a line II—II of the FIG. 1.
Figure 3:
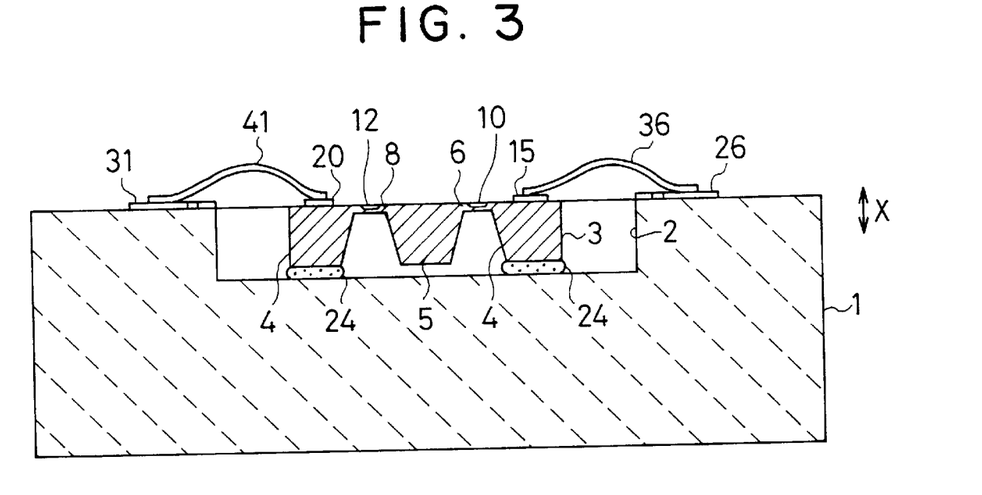
FIG. 3 is a cross-sectional view along a line III—III of the FIG.1.

FIG. 1 is a plan view of an acceleration sensor according to the present invention. FIGS. 2 and 3 are cross-sectional views of the acceleration sensor shown in FIG. 1, viewed from lines II—II and III—III of FIG. 1, respectively. A rectangular cavity 2 is formed on a ceramic substrate 1. A semiconductor sensor chip 3 made of a crystal silicon plate with a 100 surface is mounted in the cavity 2. The sensor chip has a rectangular frame 4, a weight 5 and thin bridge portions 6, 7, 8 and 9. The rectangular weight 5 is suspended by the thin and stripe-shaped bridge portions 6 through 9 in the cavity 2. The sensor chip 3 shown here is small in size in order to reduce its cost. Accordingly, the size of the frame 4 and the weight 5 is made as small as possible.

Figure 4:
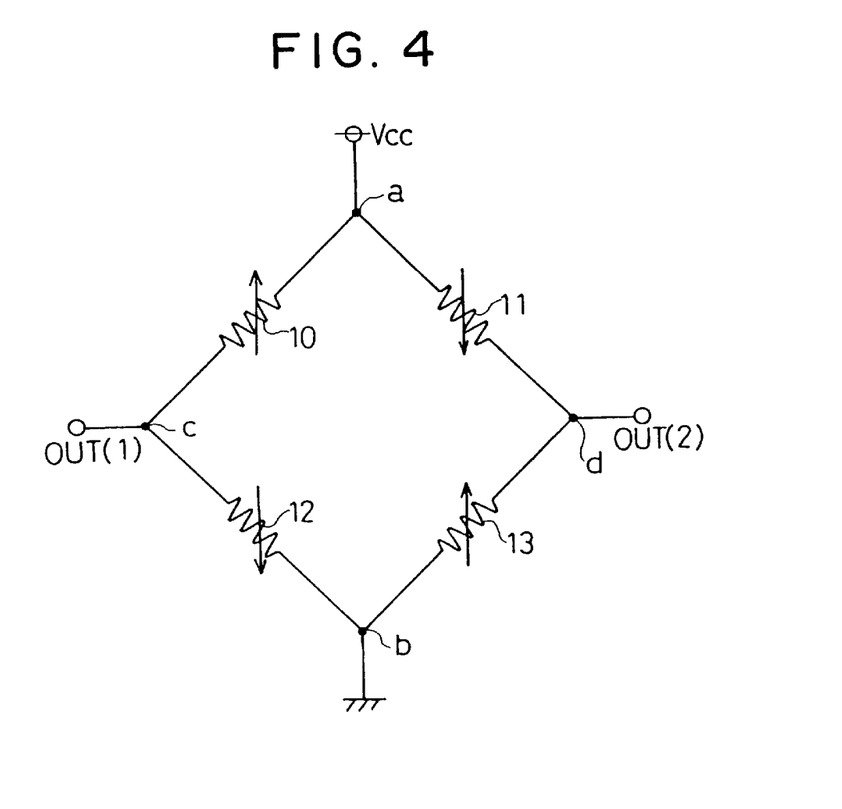
FIG. 4 is a bridge circuit showing connections of strain gages.

On the bridge portions 6 through 9, strain gages 10, 11, 12 and 13 are formed, respectively. The strain gages 10 through 13 are piezoresistance layers made by diffusing impurity. The strain gages 10 through 13 are connected in a bridge circuit as shown in FIG. 4. A constant voltage $V_{cc}$ is supplied to a junction "a" connecting the strain gages 10 and 11. A junction "b" connecting the strain gages 12 and 13 is grounded. A junction "c" connecting the strain gages 10 and 12, and a junction "d" connecting the strain gages 11 and 13 constitute output terminals.

When the weight 5 is displaced by an acceleration in the direction "X" shown in FIG. 3, strain is given to the four bridge portions 10 through 13. Resistances of the bridge portions are changed by the strain and an output is obtained from the junctions "c" and "d" of the bridge circuit shown in FIG. 4.

Aluminum bonding pads 14, 15, 16, 17, 18, 19, 20, 21, 22 and 23 are formed on an upper surface of the frame 4. The sensor chip 3 is mounted in the cavity 2 of the substrate 1. A bottom surface of the frame 4 of the sensor chip 3 is bonded on the cavity 2 by a silicone resin adhesive 24 having low stress characteristics. The stress value of the adhesive 24 is around 10N/mm$^2$ which is lower than that of an epoxy resin by three figures. By using the low stress adhesive, the stress from the substrate 1 is reduced, and, accordingly, adverse influence to sensor characteristics is avoided. If an adhesive having a high Young's modulus, i.e., high stress characteristics is used, acceleration detection errors would occur, because deformation stress caused by the difference of coefficients of linear expansion between the substrate 1 and the sensor chip 3 cannot be absorbed by the adhesive, and strain is given to the sensor chip 3 even when there is no actual acceleration.

Preferably, the sensor chip 3 is mounted in the cavity 2 so that the upper surface of the chip 3 and the upper surface of the substrate 1 are at the same level. This makes wiring between the sensor chip 3 and the substrate 1 easier.

Bonding pads 25, 26, 27, 28, 29, 30, 31, 32, 33 and 34, made of gold (Au), are formed on an upper surface of the substrate 1. The bonding pads 14 through 23 formed on the sensor chip 3 and the bonding pads 25 through 34 formed on the substrate 1 are bonded and connected, respectively, by aluminum bonding wires 35, 36, 37, 38, 39, 40, 41, 42, 43 and 44.

Also mounted on the substrate 1 are sensor driving circuits including a power supply circuit for supplying the constant voltage $V_{cc}$ to the bridge circuit shown in FIG. 4 and signal processing circuits for amplifying the output from the bridge circuit.

The aluminum wires 35 through 44 are bonded on the respective bonding pads by ultrasonic bonding. In the ultrasonic bonding process, an ultrasonic vibration is applied to the wires and bonding pads to be bonded to each other in a direction toward the center O of the sensor chip 3. The wires 35 through 44 are all extended radially from the center of the sensor chip 3.

Figure 5:
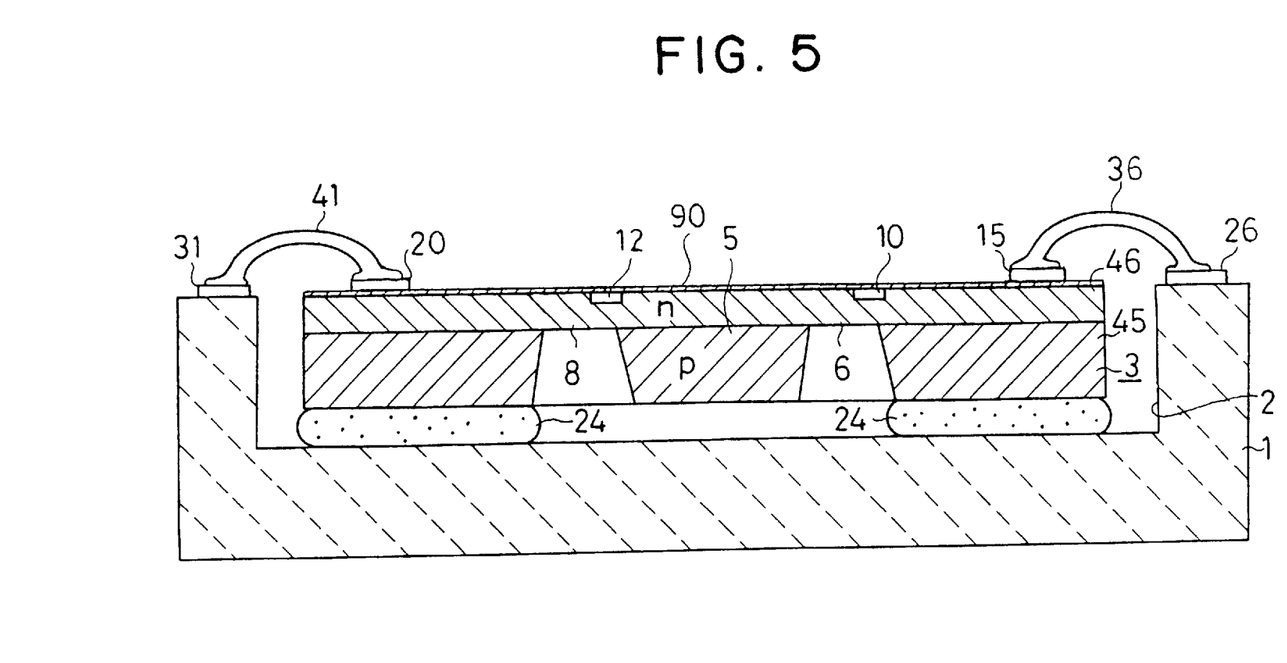
FIG. 5 is a detailed drawing of FIG. 3 for explaining a structure of the acceleration sensor.

Referring to FIG. 5, which shows more details of FIG. 3, the sensor chip 3 will be explained. The sensor chip 3 is made of a p-type silicon plate 45 on which an n-type epitaxial layer 46 is formed. Certain portions of the p-type silicon plate 45 are removed by etching in order to form bridge portions 6 through 8 made of the n-type epitaxial layer 46. The strain gages 10 through 13, made of a p-type impurity region, are formed on the respective bridge portions 6 through 9. In FIG. 5, the strain gages are shown as 10 and 12. A silicon oxide layer 90 is formed on the n-type epitaxial layer 46.

Figure 6:
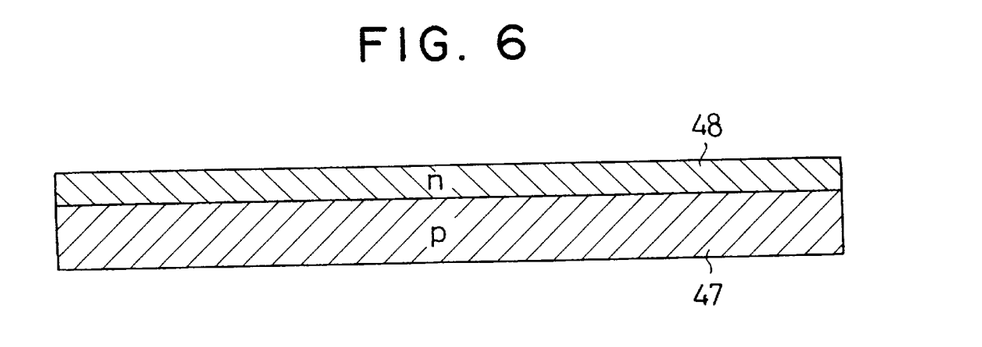
FIGS. 6, 7, 8 and 9 are drawings for explaining manufacturing processes of a sensor chip used in the acceleration sensor.
Figure 7:
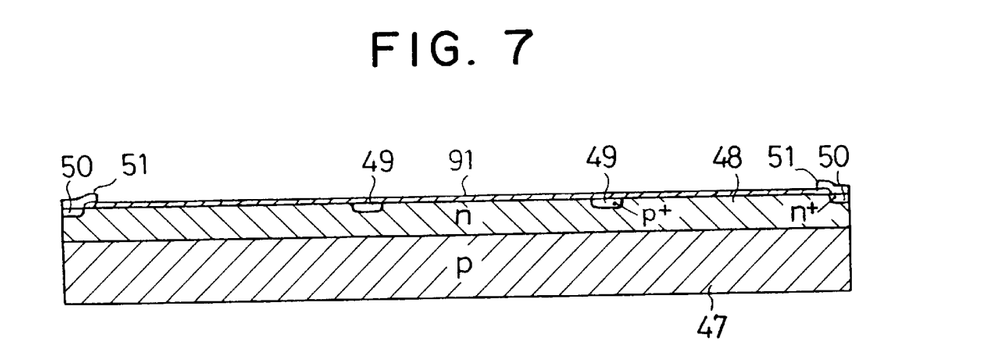

Referring to FIGS. 6, 7, 8 and 9, manufacturing processes of the sensor chip 3 will be explained. As shown in FIG. 6, a n-type epitaxial layer 48 is formed on the p-type silicon plate 47. As shown in FIG. 7, p$^+$-type impurity regions 49 (for strain gages) are formed on predetermined portions on the surface of the n-type epitaxial layer 48 by, for example, an ion implantation method. Along scribe lines, n$^+$-type impurity regions 50 are formed on the n-type epitaxial layer 48. Aluminum wiring 51 is connected to the n$^+$-type impurity regions 50. Then, a silicon oxide film 91 is formed on the n-type epitaxial layer 48 and bonding pads 14 through 23 are formed on the silicon oxide film 91.

Figure 8:
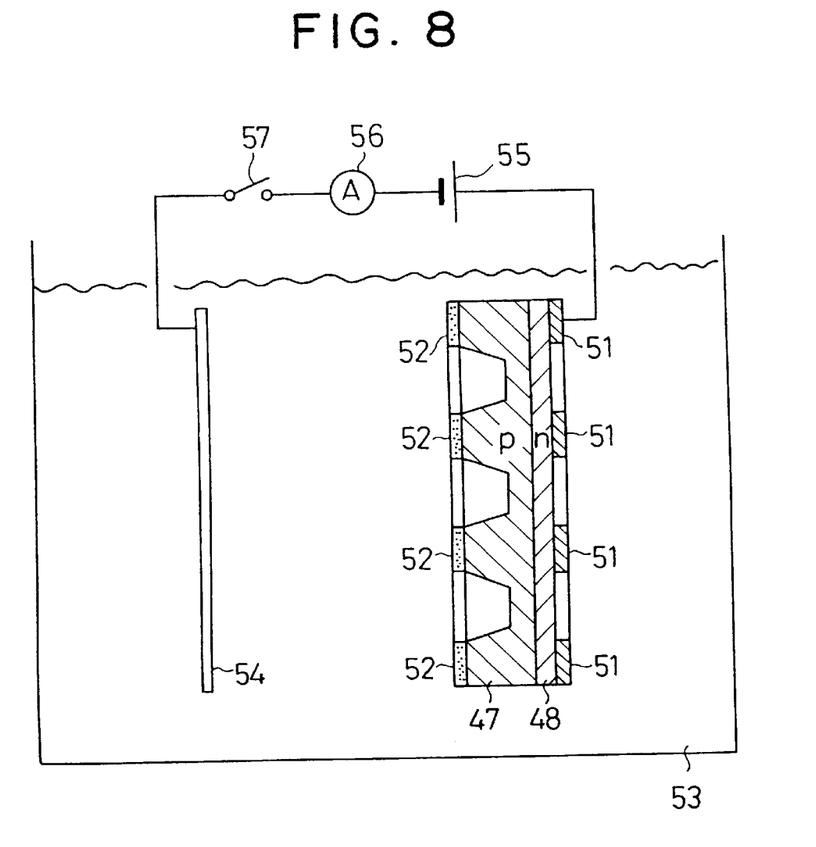

As shown in FIG. 8, a masking material 52 is placed on predetermined portions of the p-type silicon plate 47. Then, the wafer is dipped in a vessel containing KOH solution 53 therein, and an electrode plate 54 made of Pt is also dipped in the solution 53. The wafer and the electrode plate 54 are placed in the solution 53 so that they face each other. A constant voltage source 55 is connected between the aluminum wiring 51 on the wafer and the electrode plate 54. An ammeter 56 and a switch 57 are connected to the voltage source 55 in series. The switch 57 is closed to start electrochemical etching of the wafer.

Figure 9:
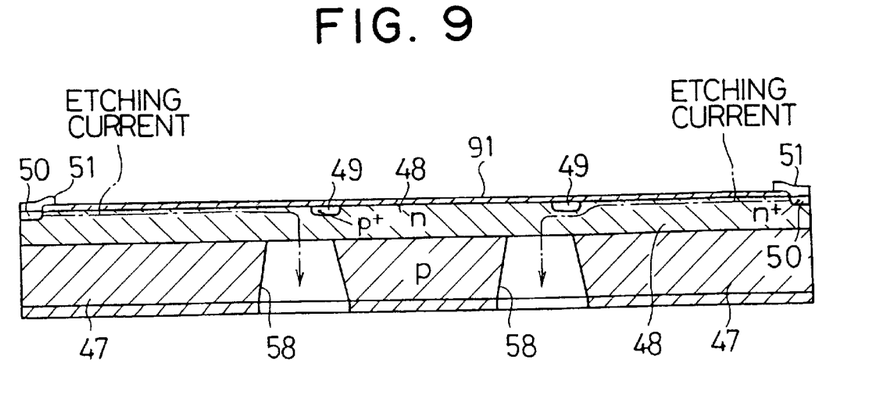

As shown in FIG. 9, electric current for etching flows from the aluminum wiring 51 toward the electrode plate 54 through the n$^+$-type impurity region 50 and n-type epitaxial layer 48. Portions of p-type silicon plate 47 are etched by the etching current. The etching current decreases when p-type silicon plate 47 is etched up to the surface of the n-type epitaxial layer 48, and then the switch 57 is opened to stop the etching. Thus, predetermined portions 58 of the p-type silicon plate are etched off and a thin layer for bridge portions are formed. Then, predetermined portions of the n-type epitaxial layer 48 are etched to form through-ditches, thus forming the sensor chip 3 shown in FIG. 1 which has the frame 4, the weight 5 and the bridge portions 6 through 9.

After the foregoing processes, the wafer is sliced into individual sensor chips. The bonding pads 25 through 34 on the substrate 1 are formed in a separate process. The sensor chip 3 is bonded on the surface of the cavity 2 of the substrate 1 by an adhesive 24. Then, the aluminum wires 35 through 44 are bonded on the bonding pads 14 through 23, respectively.

Figure 10:
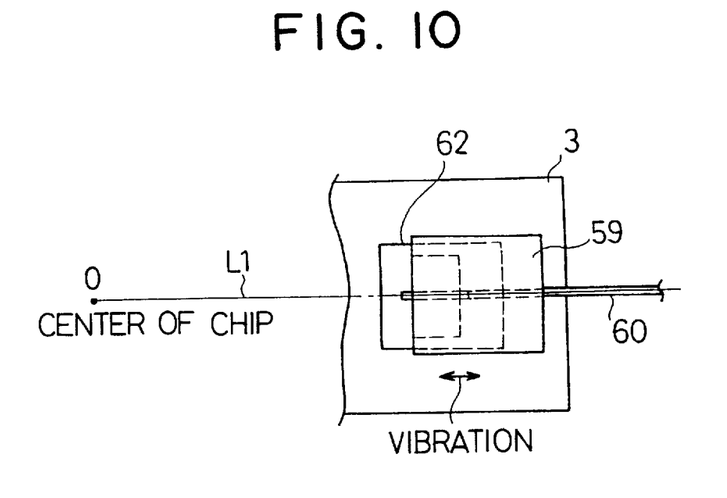
FIG. 10 is a plan view for explaining a wire bonding process.
Figure 11:
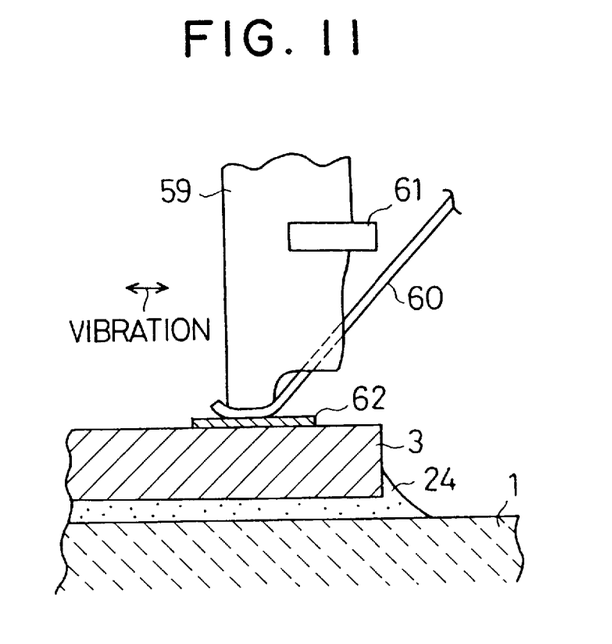
FIG. 11 is a cross-sectional view for explaining the wire bonding process.
Figure 12:
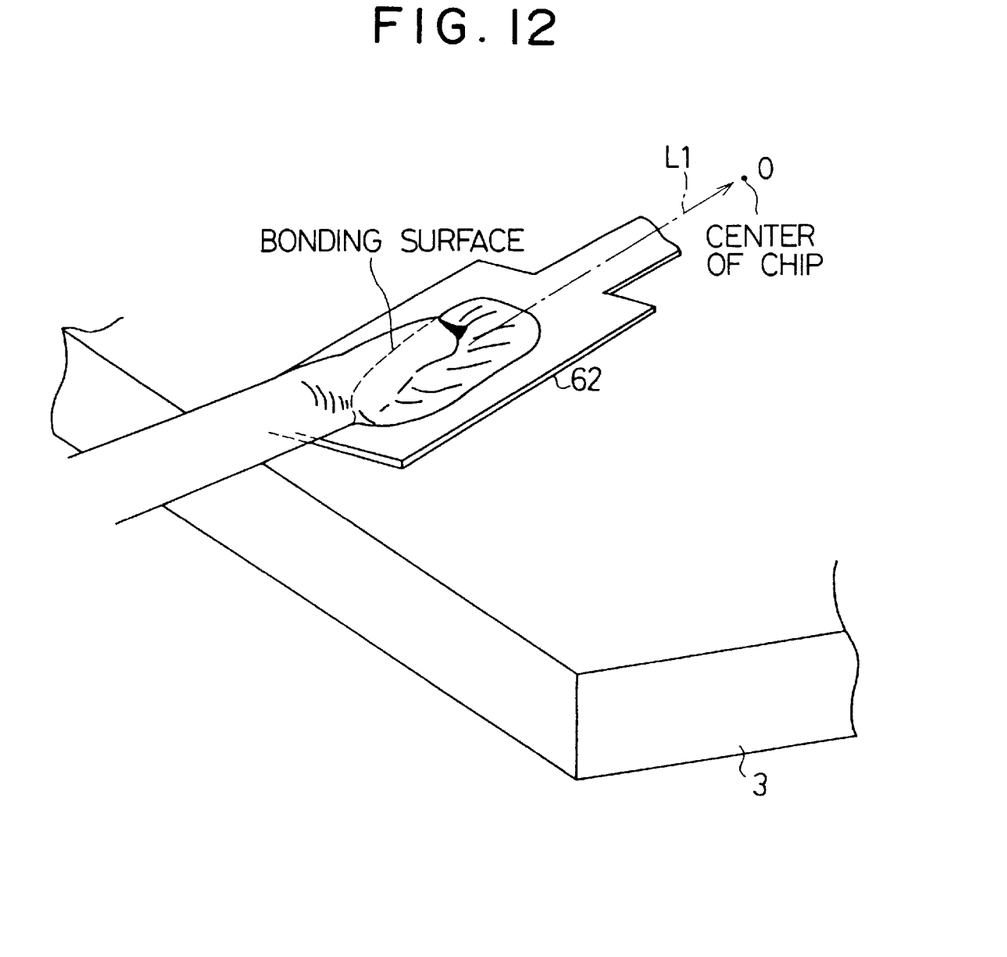
FIG. 12 is a perspective view for explaining the wire bonding process.

The method of bonding will be explained referring to FIGS. 10, 11 and 12. A wedge tool 59 having a wedge-shaped tip supports an end of an aluminum wire 60. A vibrator 61 is mounted on the wedge tool 59. While the wedge tool 59 presses down an end of the aluminum wire 60 on a bonding pad 62, an ultrasonic vibration is imposed on the wire 60, and thereby the wire 60 is bonded to the pad 62. The ultrasonic vibration is imposed on the wire 60 in a direction toward the center of the sensor chip 3 (the direction L1 shown in FIG. 10). Due to the vibration given to the wire in the direction toward the center of the chip 3, the wire is deformed and the bonding surface between the wire and the pad spreads in an oval shape as shown in FIG. 12. The major axis of the oval shape lies in the direction L1, i.e., it extends toward the center of the sensor chip. Under the ultrasonic vibration of the wedge tool 59 in the direction L1, no rotational moment (as explained above using FIGS. 15 and 16) is given to the sensor chip. In other words, the distance L shown in FIG. 15 is zero and, accordingly, the rotational moment M (=F×L) becomes zero in this case. Therefore, the wire is perfectly bonded to the pad without fail, even when the small size sensor chip 3 is mounted on the substrate 1 with an adhesive having a low stress characteristics. In other words, in use of the improved wire bonding method according to the present invention, the sensor chip 3 can be made smaller, and an adhesive having a low stress characteristics can be used for obtaining reliable sensor output.

All of the bonding wires are bonded to the respective bonding pads 14 through 23 by the improved method. The bonding wires are also bonded to the respective bonding pads 25 through 34 formed on the substrate 1. Thus, electrical connections of the sensor device are completed.

Next, a second embodiment of the present invention will be explained referring to FIGS. 13 and 14. In the first embodiment, the improved wire bonding method is applied to the bonding wires between the sensor chip 3 and the substrate 1. In the second embodiment, the wire bonding between the sensor chip 3 and other integrated circuit chips such as a signal processor chip 65 is performed.

Figure 13:
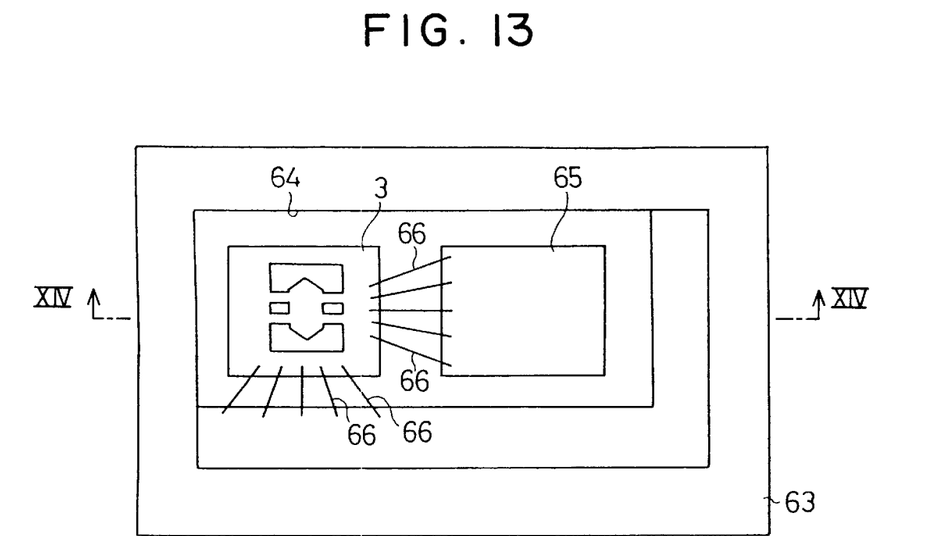
FIG. 13 is a plan view showing a second embodiment of the present invention.
Figure 14:
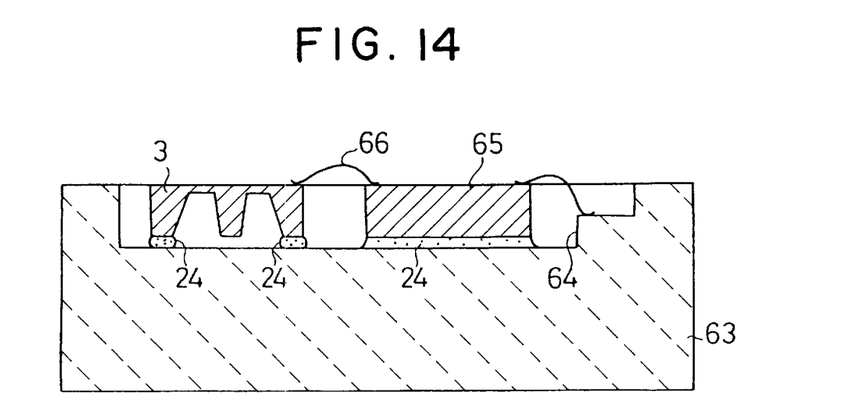
FIG. 14 is a cross-sectional view along a line XIV—XIV of FIG. 13.

In FIG. 13, a semiconductor acceleration sensor device including a signal processor is shown. FIG. 14 is a cross-sectional view along a line XIV—XIV of the FIG. 13. A cavity 64 is formed on the ceramic substrate 63. A sensor chip 3 and a signal processor chip 65 are disposed in the cavity 64, and both chips are bonded to the substrate 63 with an adhesive 24. The sensor chip 3, as mentioned before, has a frame, a weight, bridge portions, and bonding pads formed on the upper surface thereof. The signal processor chip 65 also has bonding pads formed thereon.

The ultrasonic bonding is performed, in the same manner as in the first embodiment, to bond the wires 66 to the bonding pads on the sensor chip 3. In the bonding process, the vibration of the wedge tool 59 is imposed in the direction toward the center of the sensor chip 3. The bonded wires 66 extend radially from the center of the sensor chip 3. The wires 66 are further bonded to bonding pads on the signal processor chip 65.

Aluminum-silicon wires may be used as the bonding wires in place of the aluminum wires mentioned above. The bonding method described above is not limited to the ultrasonic bonding, but it may be used in a bonding process combining the ultrasonic and thermocompression bonding.

The method of wire bonding according to the present invention is also applicable to other sensors, such as semiconductor pressure sensors, semiconductor yaw rate sensors and so forth. In addition, the method may be widely used for bonding wires in semiconductor devices having semiconductor chips bonded to a substrate.

Though the embodiments, in which the bonded wires are extended from the sensor chip along radial lines extending from the center of the sensor chip, have been disclosed herein, the extending direction of the bonded wires is not necessarily limited to this direction, as long as the ultrasonic vibration is applied in the direction toward the center of the sensor chip.

Although the present invention has been fully described in connection with preferred embodiments thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. A semiconductor device comprising:

a substrate;

a semiconductor chip having bonding pads thereon, the semiconductor chip being mounted on the substrate with an adhesive; and wires bonded to the bonding pads, each wire having a bonded portion that has a shape elongated substantially along a line extending radially from a center of the semiconductor chip.

2. The semiconductor device according to claim 1, wherein:

the semiconductor chip includes thin bridge portions which are not in contact with the substrate, and each thin bridge portion has a strain gage formed thereon.

3. The semiconductor device according to claim 1 or 2, wherein:

the adhesive is a material made of silicon resin.

4. The semiconductor device according to claim 1 or 2, wherein:

an upper surface of the semiconductor chip and an upper surface of the substrate are substantially at the same level.

5. The semiconductor device according to claim 3, wherein:

an upper surface of the semiconductor chip and an upper surface of the substrate are substantially at the same level.

6. The semiconductor device according to claim 1 or 2, wherein:

the substrate is made of ceramics.

7. The semiconductor device according to claim 1 or 2, further comprising:

an integrated circuit chip, wherein the bonded wires are connected to the integrated circuit chip.

8. The semiconductor device according to claim 1, wherein:

the bonded portion of each wire is formed by applying ultrasonic vibrations to the wire in a direction along the radially extending line.

9. The semiconductor device according to claim 1, wherein:

each wire extends substantially in a radial direction.

* * * * *